(12) United States Patent
Ozenne (10) Patent No.: US 8,160,533 B2
(45) Date of Patent: Apr. 17, 2012

(54) SELF-CALIBRATING MIXER (75) Inventor: Patrick A. Y. Ozenne, Benouville (FR)

(73) Assignee: ST-Ericsson SA, Geneva (CH)

( * ) Notice: Subject to any disclaimer, the term of this patent is extended or adjusted under 35 U.S.C. 154(b) by 469 days.

(21) Appl. No.: 12/299,297

(22) PCT Filed: Mar. 27, 2007

(86) PCT No.: PCT/IB2007/051068
§ 371 (c)(1), (2), (4) Date: Aug. 3, 2009

(87) PCT Pub. No.: WO2007/113733
PCT Pub. Date: Oct. 11, 2007

(65) Prior Publication Data
US 2009/0305648 A1    Dec. 10, 2009

(30) Foreign Application Priority Data
Mar. 30, 2006  (EP) .................................. 06300306

(51) Int. Cl.
*H04B 1/26* (2006.01)
(52) U.S. Cl. .................. 455/313; 455/334; 455/118
(58) Field of Classification Search .......... 455/313–334, 455/118; 327/359, 358
See application file for complete search history.

(56) References Cited

U.S. PATENT DOCUMENTS

| | | | |
|---|---|---|---|
| 5,304,955 A * | 4/1994 | Atriss et al. ................... | 331/1 R |
| 6,370,361 B1 * | 4/2002 | Hung et al. ...................... | 455/83 |
| 7,657,241 B2 | 2/2010 | Shah | |
| 2003/0040292 A1 * | 2/2003 | Peterzell et al. .............. | 455/147 |
| 2003/0153994 A1 * | 8/2003 | Jin et al. ........................... | 700/99 |
| 2004/0137870 A1 * | 7/2004 | Kivekas et al. ............... | 455/326 |
| 2005/0124311 A1 | 6/2005 | Mahmoudi et al. | |
| 2005/0159124 A1 | 7/2005 | Shah | |
| 2006/0035611 A1 | 2/2006 | Connell et al. | |
| 2008/0139164 A1 | 6/2008 | Barre | |

OTHER PUBLICATIONS

International Search Report; PCT/IB2007/051068; Sep. 9, 2007.

* cited by examiner

*Primary Examiner* — Lana N Le
(74) *Attorney, Agent, or Firm* — Hogan Lovells US LLP (57) ABSTRACT

Mixer circuits (1) comprise mixers (2) for receiving input signals and oscillation signals and for outputting output signals. By providing the mixers (2) with loads (3) having adjustable load values and by introducing adjustors (4) for adjusting and sweeping the loads (3), which adjusted loads (3) have different load values at different moments in time, and by introducing detectors (5) for detecting components such as second order intermodulation products of the output signal per load value and selectors (6) for selecting detection results and for instructing the adjustors (4) to set the loads (3) in response to the selected detection result, the mixer (2) is calibrated. The detectors (5) comprise filtering circuitry (52) for filtering the components and comprising slope detection circuitry (53) and the electors (6) comprise comparison circuitry (61) for comparing slope values with each other for finding an extreme slope value that defines the detection result to be selected. The input signals comprise amplitude modulation jammer signals or two tones signals.

11 Claims, 5 Drawing Sheets

SELF-CALIBRATING MIXER

FIELD OF THE INVENTION

The invention relates to a mixer circuit, and also relates to a device comprising a mixer circuit, to a method, to a computer program product and to a medium.

Examples of such a mixer circuit are circuits comprising mixers. Examples of such a device are devices comprising transmitters, receivers and/or transceivers.

BACKGROUND OF THE INVENTION

A prior art mixer circuit is known from EP 1 531 553-A1, which discloses in its FIGS. 2 and 3 a mixer circuit comprising a mixer for receiving an input signal and an oscillation signal and for outputting an output signal and comprising a compensation branch in parallel to the mixer for receiving the input signal and for in response to the input signal providing an adjustable compensation signal. The output signal and the compensation signal are combined for compensating a distortion of the mixer.

The known mixer circuit is disadvantageous, inter alia, owing to the fact that a parallel compensation branch is used. Such an additional branch must estimate the distortion that is to be compensated all the time, during calibration as well as during normal operation, and thereby introduces additional noise and additional distortion itself.

SUMMARY OF THE INVENTION

It is an object of the invention, inter alia, to provide a mixer circuit comprising a mixer in which mixer circuit a distortion of the mixer is reduced without a parallel compensation being needed.

Further objects of the invention are, inter alia, to provide a device comprising a mixer circuit, a method, a computer program product and a medium without a parallel compensation being needed.

The mixer circuit according to the invention comprises:

a mixer for receiving an input signal and an oscillation signal and for outputting an output signal, which mixer comprises a load having an adjustable load value, an adjustor for adjusting the load, the adjusted load having different load values at different moments in time, a detector for detecting a component of the output signal per load value, and a selector for selecting a detection result and for instructing the adjustor to set the load in response to the selected detection result, the set load having a set load value.

By providing the mixer circuit with a mixer comprising a load having an adjustable load value and with an adjustor for sweeping the load and with a detector for detecting components of the output signal for the swept load and with a selector for selecting a detection and in response setting the load, a distortion of the mixer is reduced without a parallel compensation needing to be introduced.

The mixer circuit according to the invention is further advantageous, inter alia, in that its calibration and its normal operation are separated from each other.

An embodiment of the mixer circuit according to the invention is defined by the detector comprising filtering circuitry for filtering the component and comprising slope detection circuitry, the detection of the component per load value comprising a slope detection of the component per load value, and the selector comprising comparison circuitry for comparing slope values with each other for finding an extreme slope value that defines the selected detection result. By selecting a detection result for which a slope value is an extreme value, such as a minimum value, and by setting a load with a set load value for which the detection result is selected, a distortion of the mixer is minimized for the particular component.

An embodiment of the mixer circuit according to the invention is defined by the component comprising a second order intermodulation product. The second order intermodulation product or IM2 is responsible for relatively much distortion. Therefore it is important to reduce the distortion of the mixer for this particular (frequency) component. A second order input intercept point or IIP2 represents an amplitude of the input signal at which a desired output signal in amplitude becomes equal to a spectral component of the second order intermodulation product. So, a relatively small second order intermodulation product results in a relatively high second order input intercept point, which is an important demand in for example wireless technologies. Further information about IM2 and IIP2 is disclosed in US-Application 2005-0124311 and US-Application 2006-0035611.

An embodiment of the mixer circuit according to the invention is defined by the input signal comprising an amplitude modulation jammer signal or a two tones signal. Each one of these input signals has proven to function well. The amplitude modulation jammer signal for example comprises a 20 kHz amplitude modulation jammer signal and the two tones signal for example comprises a 100 kHz two tones signal, without excluding other frequencies.

An embodiment of the mixer circuit according to the invention is defined by further comprising:

a controller comprising the adjustor and the selector for in a calibration mode sweeping the adjustor and for in a non-calibration mode locking the adjustor.

The controller for example comprises or forms part of a processor or a processor system and the adjustor for example comprises a hardware or software counter and/or a hardware or software converter for converting a count value into an adjustment signal destined for the load. In the calibration mode the load is to be swept and then to be set. In the non-calibration mode such as a normal operation mode the load should keep its set load value.

An embodiment of the mixer circuit according to the invention is defined by further comprising:

a controller comprising the adjustor for in respective sensitive and non-sensitive modes providing adjustment signals with respective smaller and larger steps to the load.

In a sensitive mode a difference between two subsequent adjustment signals should be a relatively small step and in a non-sensitive mode a difference between two subsequent adjustment signals should be a relatively large step.

An embodiment of the mixer circuit according to the invention is defined by further comprising:

a controller comprising the adjustor with a clock input for receiving a clock signal and with an output for providing an adjustment signal to the load and comprising a clock signal generator for generating the clock signal for in respective fast and slow modes generating respective faster and more slowly clock signals.

In a fast mode the clock signal for clocking the adjustor should be relatively fast and in a slow mode the clock signal for clocking the adjustor should be relatively slow.

The device according to the invention comprises the mixer circuit according to the invention.

An embodiment of the device according to the invention is defined by further comprising:

a receiver comprising the mixer,
a transmitter, and an input signal generator for receiving a transmitter signal from the transmitter via a transmitter switch and for in response to the transmitter signal providing the input signal via a receiver switch to the mixer.

The switches couple the receiver and the transmitter via the input signal generator to each other in a calibration mode and couple the receiver and the transmitter to one antenna or to their own antennas in a non-calibration mode such as a normal operation mode.

Embodiments of the device according to the invention and of the method according to the invention and of the computer program product according to the invention and of the medium according to the invention correspond with the embodiments of the mixer circuit according to the invention.

The invention is based upon an insight, inter alia, that a parallel compensation or an adjustment of a parallel compensation is to be avoided, and is based upon a basic idea, inter alia, that a load of a mixer should have an adjustable load value and an adjustor should sweep the load and a detector should detect a component of a mixer output signal for the swept load and selector should select a detection and in response set the load.

The invention solves the problem, inter alia, to provide a mixer circuit comprising a mixer in which mixer circuit a distortion of the mixer is reduced without a parallel compensation being needed. The mixer circuit according to the invention is further advantageous, inter alia, in that its calibration and its normal operation are separated from each other.

These and other aspects of the invention will be apparent from and elucidated with reference to the embodiments(s) described hereinafter.

DETAILED DESCRIPTION OF EMBODIMENTS

Figure 1:
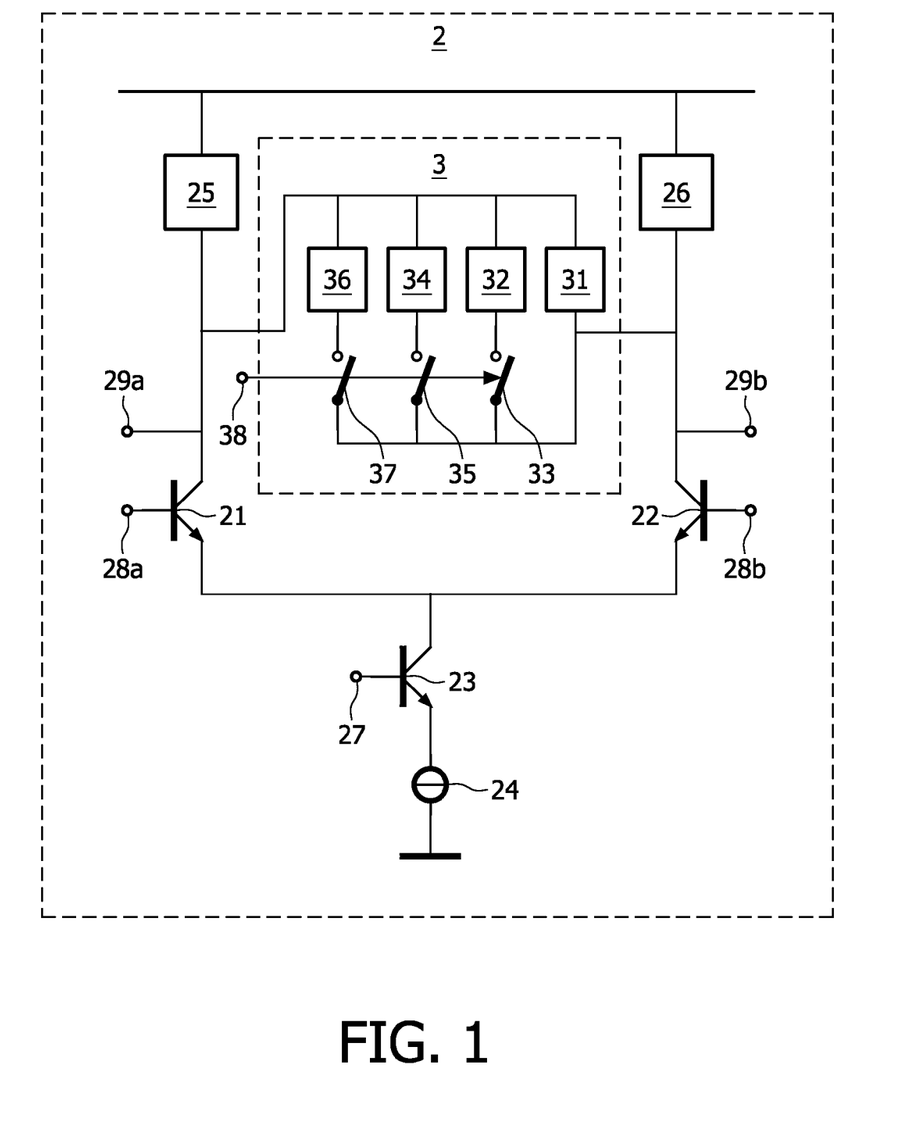
FIG. 1 shows diagrammatically a mixer comprising an adjustable load.

The mixer 2 shown in the FIG. 1 comprises first and second transistors 21 and 22 comprising first main electrodes (for example emitters or sources) coupled to each other and comprises a third transistor 23 comprising a first main electrode (for example an emitter or a source) coupled via a current source 24 to ground and comprising a second main electrode (for example a collector or a drain) coupled to the first main electrodes of the first and second transistors 21 and 22. A second main electrode (for example a collector or a drain) of the first transistor 21 is coupled via a first impedance 25 (for example a parallel circuit of a capacitor and a resistor) to a reference terminal and a second main electrode (for example a collector or a drain) of the second transistor 22 is coupled via a second impedance 26 (for example a parallel circuit of a capacitor and a resistor) to the reference terminal.

A control electrode (for example a basis or a gate) of the third transistor 23 constitutes an input 27 for receiving an input signal and control electrodes (for example bases or gates) of the first and second transistors 21 and 22 constitute an oscillator input 28a,28b for receiving an oscillator signal and the second main electrodes of the first and second transistors 21 and 22 constitute an output 29a,29b for outputting an output signal. The second main electrodes of the first and second transistors 21 and 22 are further coupled to each other via a load 3. This load 3 comprises four parallel branches, one branch comprising an impedance 31 and the other three branches each comprising a serial construction of an impedance 32,34,36 and a switch 33,35,37. The load 3 further comprises a control input 38 for receiving an adjustment signal for adjusting the load 3 by operating the switches 33,35,37. Different constructions per branch and different constructions of the branches and different numbers of branches are not to be excluded.

Figure 2:
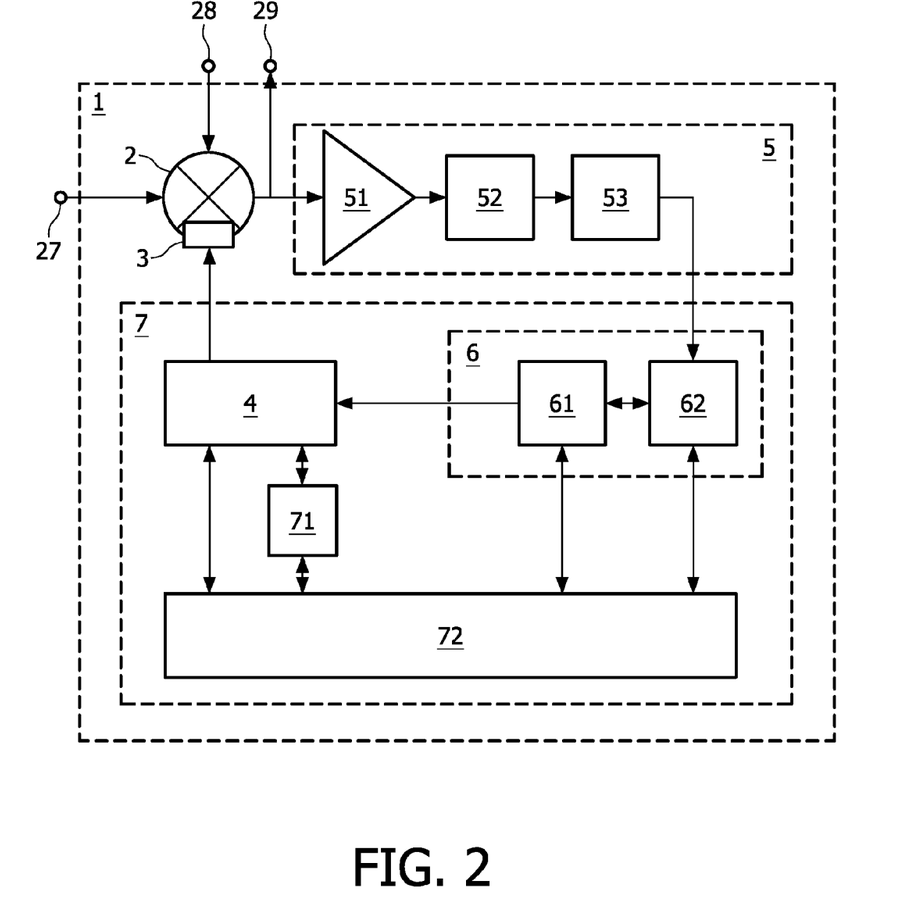
FIG. 2 shows diagrammatically a mixer circuit according to the invention.

The mixer circuit 1 according to the invention shown in the FIG. 2 comprises the mixer 2 with the load 3 as shown in the FIG. 1 for receiving an input signal via the input 27 and for receiving an oscillation signal via the oscillation input 28 (=28a & 28b) and for outputting an output signal via the output 29 (=29a & 29b). As explained for the FIG. 1, the load 3 has an adjustable load value. The mixer circuit 1 further comprises an adjustor 4 for adjusting the load 3 by supplying an adjustment signal to the load 3 via the control input 38. In a calibration mode the adjusted load 3 is swept such that it has different load values at different moments in time. The mixer circuit 1 further comprises a detector 5 for detecting a component of the output signal per load value and a selector 6 for selecting a detection result and for instructing the adjustor 4 to set the load in response to the selected detection result. The set load 3 has a set load value.

The detector 5 comprises an amplifier 51 and filtering circuitry 52 for filtering the component and slope detection circuitry 53 coupled to each other in a serial construction. The detection of the component per load value comprises a slope detection of the component per load value. The selector 6 comprises comparison circuitry 61 for comparing slope values with each other for finding an extreme slope value that defines the selected detection result and thereto comprises for example a memory 62 coupled to an output of the slope detection circuitry 53 for receiving and storing slope values. The memory 62 is coupled to the comparison circuitry in one direction for receiving instructions to provide one or more slope values and in the other direction for providing the slope values.

The mixer circuit 1 further comprises a controller 7 that for example comprises the adjustor 4 and the selector 6 for in a calibration mode sweeping the adjustor 4 and for in a non-calibration mode locking the adjustor 4 and/or for in respective sensitive and non-sensitive modes providing adjustment signals with respective smaller and larger steps to the load 3. The adjustor 4 for example comprises a clock input for receiving a clock signal and an output for providing an adjustment signal to the load 3 and the controller for example comprises a clock signal generator 71 for generating the clock signal for in respective fast and slow modes generating respective faster and more slowly clock signals.

The controller 7 further for example comprises a processor 72 for controlling the adjustor 4 and the signal clock generator 71 and the comparison circuitry 61 and the memory 62. Alternatively, the processor may be integrated into the adjustor 4 and/or the signal clock generator 71 and/or the comparison circuitry 61 and/or the memory 62, or the adjustor 4 and/or the signal clock generator 71 and/or the comparison circuitry 61 and/or the memory 62 may form part of the processor 72 etc.

Figure 3:
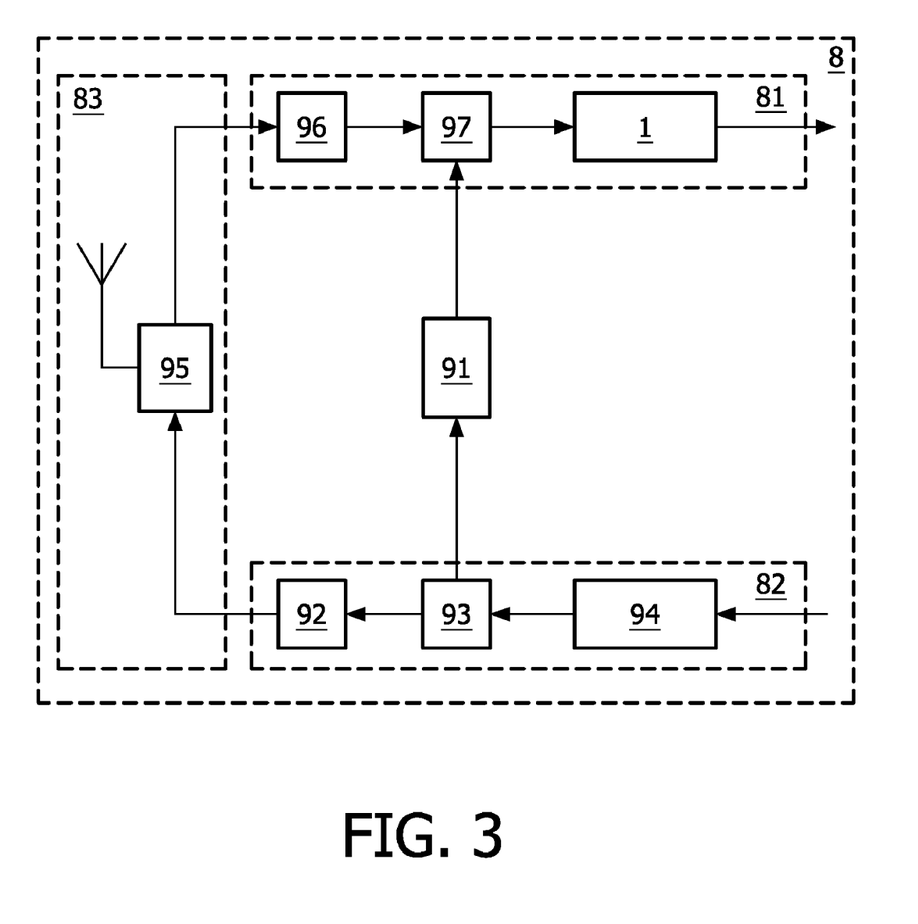
FIG. 3 shows diagrammatically a device according to the invention.

The device 8 according to the invention shown in the FIG. 3 comprises a receiver 81 comprising the mixer 2 and a transmitter 82 and an input signal generator 91 for receiving a transmitter signal from the transmitter 82 via a transmitter switch 93 and for in response to the transmitter signal providing the input signal via a receiver switch 97 to the mixer 2. The receiver 81 further comprises for example the receiver switch 97 with an operation input coupled to an output of receiving circuitry 96 and with a calibration input coupled to an output of the input signal generator 91 and with an output coupled to the input 27 of the mixer 2. The transmitter 82 further comprises for example the transmitter switch 93 with an input coupled to first transmitting circuitry 94 and with an operation output coupled to an input of second transmitting circuitry 92 and with a calibration output coupled to an input of the input signal generator 91.

The device 8 further comprises for example an antenna circuit 83 with an antenna coupled to antenna circuitry that comprises an input coupled to an output of the second transmitting circuitry 92 and that comprises an output coupled to an input of the receiving circuitry 96.

The component may for example comprise a second order intermodulation product, without excluding other components. The second order intermodulation product or IM2 is responsible for relatively much distortion. Therefore it is important to reduce the distortion of the mixer 2 for this particular (frequency) component. A second order input intercept point or IIP2 represents an amplitude of the input signal at which a desired output signal in amplitude becomes equal to a spectral component of the second order intermodulation product. So, a relatively small second order intermodulation product results in a relatively high second order input intercept point, which is an important demand in for example wireless technologies.

For this particular component, the mixer circuit 1 according to the invention as shown in the FIG. 2 functions as follows. In a calibration mode, an input signal such as for example an amplitude modulation jammer signal (for example a 20 kHz AM jammer signal) or a two tones signal (for example a 100 kHz two tones signal) is supplied to the input 27. This input signal may originate from a specific generator not shown and controlled by the controller 7 or may originate from the input signal generator 91 as later explained at the hand of the FIG. 3. Further, an oscillation signal such as a local oscillation signal is supplied to the input 28 shown in the FIG. 2 and comprising the inputs 28a and 28b shown in the FIG. 1. The load 3 receives via the control input 38 an adjustment signal originating from the adjustor 4.

In the calibration mode, via the adjustor 4, the load 3 is swept, such that the load 3 gets different load values at different moments in time. Thereto, the adjustor 4 for example comprises a counter, without excluding other kinds of adjustors, and the adjustment signal then comprises subsequent count values. In response to each count value, the load 3 is adjusted by opening and/or closing one or more of the switches 33 and 35 and 37. The advantage of using a counter is that a sweeping interval can be increased or decreased by selecting different starting values and/or ending values and that different count steps can be easily introduced (small step=large accuracy, large step=small accuracy) and that different sweeping speeds can be easily introduced by changing a clock speeds. The adjustment signal may comprise one round of increasing or decreasing count values and may comprise several rounds of increasing and/or decreasing count values such as triangle shaped signals (increasing count values followed by decreasing count values etc.). These triangle shaped signals have proven to function very well.

As a result, for each different load value of the load 3, a different output signal is generated by the mixer 2. The filtering circuitry 52 filters the IM2 component per different output signal and supplies the IM2 component per output signal to the slope detection circuitry 53, which detects the slope of the IM2 component per output signal. Slope values are stored in the memory 62 and the comparison circuitry 61 determines an extreme slope value that for example defines the load value corresponding to the output signal that has resulted in this extreme load value. The load 3 is set to this particular load value, via the adjustor 4. Thereto, the counter of the adjustor 4 is for example locked and generates a fixed count value that is used as an adjustment signal. Then, a non-calibration mode such as a normal operation mode may begin.

As discussed above, the input signal may originate from the input signal generator 91 as shown in the FIG. 3. In that case, the transmitter 82 is used for providing a transmitter signal via the transmitter switch 93 and the input signal generator 91 converts the transmitter signal into the input signal that is supplied via the receiver switch 97 to the mixer 2. The transmitter switch 93 and the receiver switch 97 therefore, in a calibration mode, couple the receiver 81 and the transmitter 82 with each other via the input signal generator 91 and, in a non-calibration mode, couple the mixer circuit 1 of the receiver 81 and the first transmitting circuitry 94 of the transmitter 82 each to the antenna circuit 83.

So, when considering that IM2 measurements depend on accuracies of the stimuli (input signal) and on accuracies of the gain of the mixer and on sensitivities of the IM2 detector, a new and inventive concept has been created to avoid the known limitations. This concept comprises the load tuning of the mixer through sweeping and the detection of components of the output signal and the selection of a proper detection result.

The detection of the IM2 component may be performed via a diode and/or the filtering circuitry 52 may comprise a diode. This diode comprises an anode for receiving an amplified output signal and comprises a cathode coupled via a parallel construction of a capacitor and a resistor to ground.

Two situations need to be distinguished from each other. According to a first situation, the clock speed of the counter of the adjustor is smaller than the IM2 frequency, and according to a second situation the clock speed of the counter of the adjustor is larger than the IM2 frequency.

Figure 4:
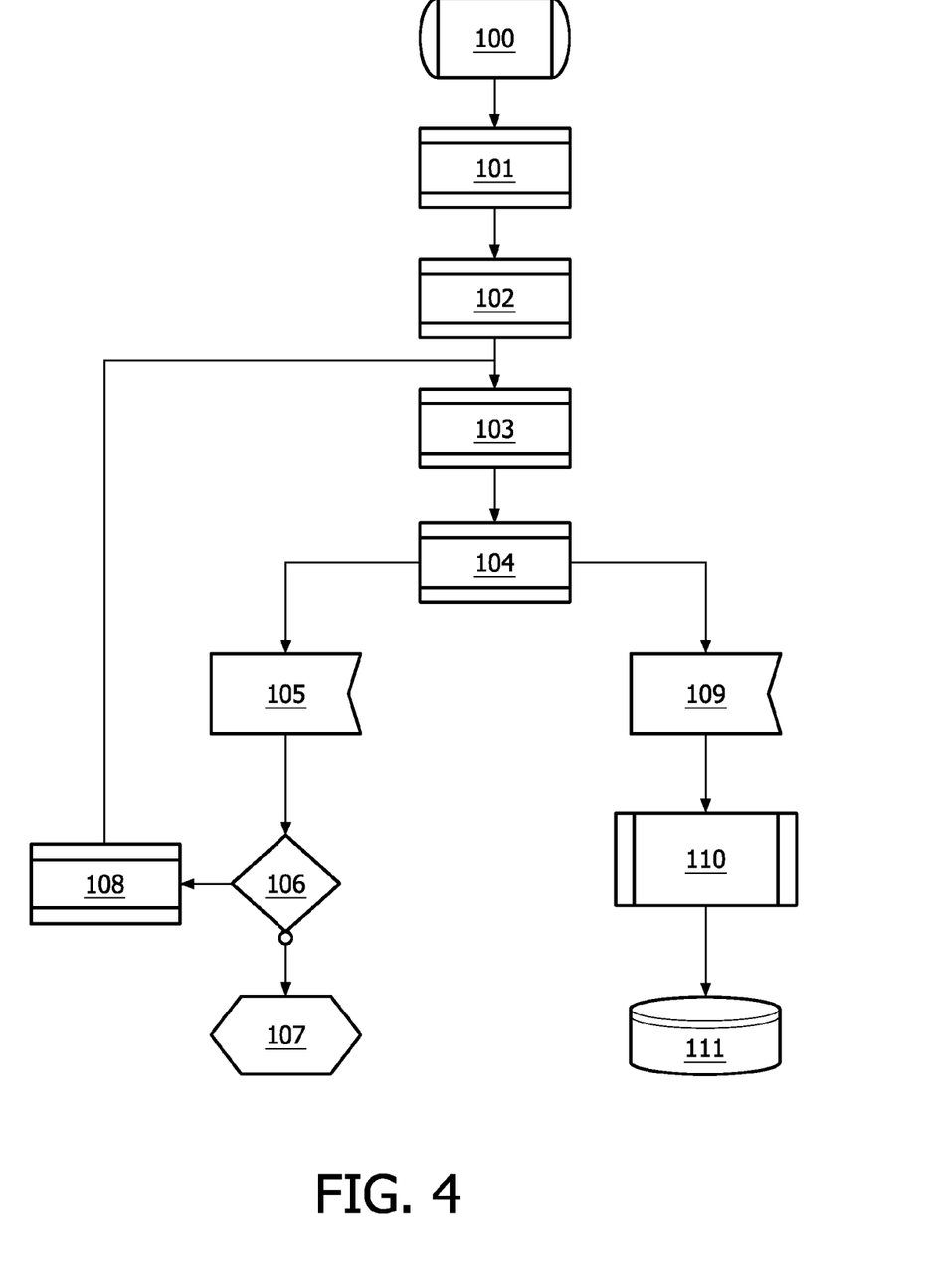
FIG. 4 shows a first operation of the mixer circuit.

In case of a fast calibration being required to improve IIP2 from 30 dBm to 60 dBm with the IM2 frequency being fixed at 3 MHz, the operation of the mixer circuit 1 could be as shown in the FIG. 4. Thereby, the blocks in the FIG. 4 have the following meaning:

Block 100: Start calibration.
Block 101: Connect stimulus.
Block 102: Connect IIP2 calibration to mixer branch.
Block 103: Load initial count value.
Block 104: Start clock.
Block 105: Overrun.
Block 106: First time, yes or no.
Block 107: Calibration error.
Block 108: Change mixer branch.
Block 109: Stop sweeping.
Block 110: Read calibration value and correct it.
Block 111: Store calibration value.

Figure 5:
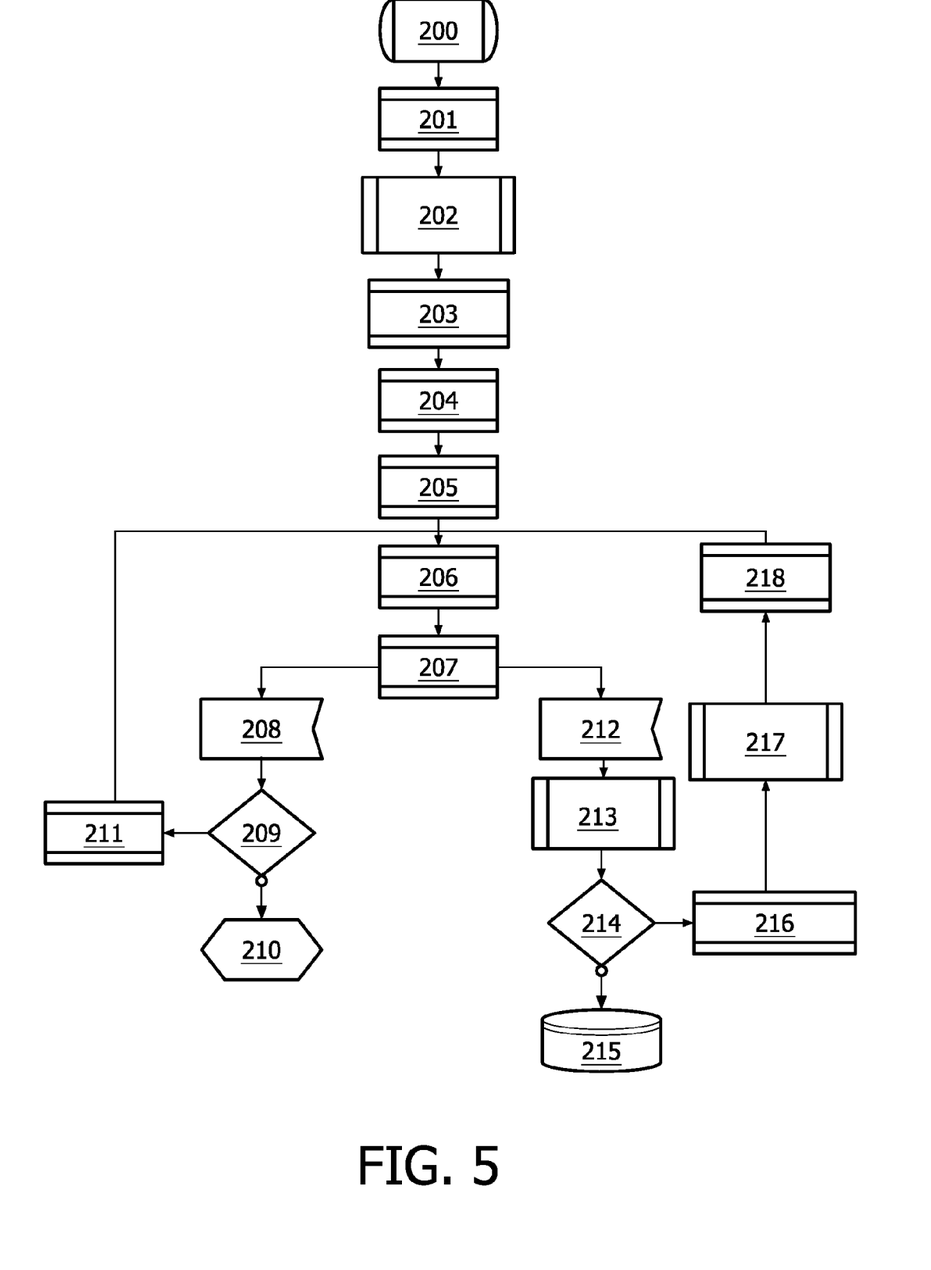
FIG. 5 shows a second operation of the mixer circuit.

In case of a maximum performance being required, the trade off might to define calibration parameters to achieve 80 dBm of IIP2 after calibration with the IM2 frequency being fixed to 100 kHz, a sensitivity has to be considered first. As the IM2 level to detect is very low, the noise level is optimized with a slope detection filter (triangle signal). When considering that the dynamic range of the system is limited, a two step approach might be done. Step 1: From 30 dBm to 60 dBm (+/−5 dBm) of IIP2 level, high clock, low precision. Step 2: To reduce the calibration duration, an initial value of the counter can be loaded such as the calibration value minus ten or zero if it was smaller than zero. From 55 dBm to 80 dBm (+/−2 dBm) of IIP2 level, high precision, low clock. In this case, the operation of the mixer circuit 1 could be as shown in the FIG. 5. Thereby, the blocks in the FIG. 5 have the following meaning:

Block 200: Start calibration.
Block 201: Connect stimulus.
Block 202: Setup IM2 frequency and clock to low precision mode.
Block 203: Setup block performance to low precision mode.
Block 204: Connect IIP2 calibration to mixer branch.
Block 205: Initial value=0.
Block 206: Load initial value.
Block 207: Start clock.
Block 208: Overrun.
Block 209: First time.
Block 210: Calibration error.
Block 211: Change mixer branch.
Block 212: Stop sweeping.
Block 213: Read calibration value and correct it.
Block 214: Low mode.
Block 215: Store calibration value.
Block 216: Initial value=calibration value minus ten or zero if it was smaller than zero.
Block 217: Setup IM2 frequency and clock to high precision mode.
Block 218: Setup block performance to high precision mode.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A mixer circuit comprising:
   a mixer for receiving an input signal and an oscillation signal and for outputting an output signal, said mixer including a load having an adjustable load value,
   an adjustor for adjusting the load, the adjusted load having different load values at different moments in time,
   a detector for detecting a component of the output signal per load value, and
   a selector for selecting a detection result and for instructing the adjustor to set the load in response to the selected detection result, the set load having a set load value,
   wherein the detector comprises filtering circuitry for filtering the component and slope detection circuitry, wherein the detection of the component per load value comprises a slope detection of the component per load value, and wherein the selector comprises comparison circuitry for comparing slope values with each other for finding an extreme slope value that defines the selected detection result.

2. The mixer circuit according to claim 1, the component comprising a second order intermodulation product.

3. The mixer circuit according to claim 1, the input signal comprising an amplitude modulation jammer signal or a two tones signal.

4. The mixer circuit according to claim 1, further comprising:
   a controller comprising the adjustor and the selector and operative in a calibration mode for sweeping the adjustor and in a non-calibration mode for locking the adjustor.

5. The mixer circuit according to claim 1, further comprising:
   a controller comprising the adjustor and operative in respective sensitive and non-sensitive modes to provide adjustment signals with respective smaller and larger steps to the load.

6. The mixer circuit according to claim 1, further comprising:
   a controller comprising the adjustor with a clock input for receiving a clock signal and with an output for providing an adjustment signal to the load and comprising a clock signal generator for generating the clock signal for in respective fast and slow modes generating respective faster and more slowly clock signals.

7. A device comprising the mixer circuit according to claim 1.

8. The device according to claim 7, further comprising:
   a receiver comprising the mixer,
   a transmitter, and
   an input signal generator for receiving a transmitter signal from the transmitter via a transmitter switch and for providing the input signal via a receiver switch to the mixer in response to the transmitter signal.

9. A method comprising the steps of:
   receiving an input signal and an oscillation signal and outputting an output signal by a mixer, and adjusting a load of the mixer, said load having an adjustable load value, the adjusted load having different load values at different moments in time, and
   detecting a component of the output signal per load value by a detector, selecting a detection result and setting the load in response to the selected detection result, the set load having a set load value.
   wherein detecting comprises filtering the component and slope detection, wherein the detection of the component per load value comprises a slope detection of the component per load value, and wherein the selecting comprises comparing slope values with each other for finding an extreme slope value that defines the selected detection result.

10. A non-transitory computer program product for performing the steps of the method according to claim 9.

11. A non-transitory medium comprising the computer program product according to claim 10.

* * * * *

UNITED STATES PATENT AND TRADEMARK OFFICE
CERTIFICATE OF CORRECTION

PATENT NO.        : 8,160,533 B2                                    Page 1 of 1
APPLICATION NO.   : 12/299297
DATED             : April 17, 2012
INVENTOR(S)       : Patrick A. Y. Ozenne It is certified that error appears in the above-identified patent and that said Letters Patent is hereby corrected as shown below:

Title Page, (57) Abstract

Line 14, "electors" should be --selectors--

Signed and Sealed this
Third Day of July, 2012

David J. Kappos
*Director of the United States Patent and Trademark Office*